(12) United States Patent
Sakamoto (10) Patent No.: US 7,116,501 B2
(45) Date of Patent: Oct. 3, 2006

(54) OPTICAL ELEMENT HOLDER, EXPOSURE APPARATUS, AND DEVICE FABRICATING METHOD

(75) Inventor: Eiji Sakamoto, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/244,503

(22) Filed: Oct. 5, 2005

(65) Prior Publication Data

US 2006/0034004 A1    Feb. 16, 2006

Related U.S. Application Data

(62) Division of application No. 10/844,919, filed on May 12, 2004, now Pat. No. 7,054,079.

(30) Foreign Application Priority Data

May 14, 2003 (JP) ............................. 2003-135930
Apr. 8, 2004 (JP) ............................. 2004-114013

(51) Int. Cl.
*G02B 7/02* (2006.01)
*H05B 3/44* (2006.01)
*H05B 3/06* (2006.01)
*H01S 3/04* (2006.01)
*H01S 3/08* (2006.01)

(52) U.S. Cl. ...................... 359/820; 359/288; 219/544; 219/522; 219/200; 372/34; 372/36; 372/107; 374/43; 355/67

(58) Field of Classification Search ................ 359/820, 359/288; 372/32, 33, 34, 36, 107; 219/544, 219/548, 200, 522, 461.1; 355/67, 53, 55; 374/20, 43

See application file for complete search history.

(56) References Cited

U.S. PATENT DOCUMENTS

| | | | | | |
|---|---|---|---|---|---|
| 4,621,929 | A | * | 11/1986 | Phillips ........................ | 374/43 |
| 4,671,624 | A | * | 6/1987 | Kahan ......................... | 359/499 |
| 4,737,798 | A | * | 4/1988 | Lonis et al. ................. | 347/247 |
| 4,918,702 | A | * | 4/1990 | Kimura ........................ | 372/34 |
| 5,640,407 | A | * | 6/1997 | Freyman et al. .............. | 372/36 |
| 5,652,763 | A | * | 7/1997 | Delfyett, Jr. ................ | 372/107 |
| 5,717,712 | A | * | 2/1998 | Swaminathan et al. ..... | 372/107 |
| 5,838,713 | A | * | 11/1998 | Shimoji ....................... | 372/92 |
| 5,848,082 | A | * | 12/1998 | Shum .......................... | 372/36 |
| 5,883,704 | A | * | 3/1999 | Nishi et al. .................. | 355/67 |
| 6,198,579 | B1 | * | 3/2001 | Rupp .......................... | 359/820 |
| 6,676,306 | B1 | * | 1/2004 | Ikeda et al. .................. | 385/92 |
| 6,697,399 | B1 | * | 2/2004 | Kimura et al. ................ | 372/36 |
| 6,768,600 | B1 | * | 7/2004 | Dieker ........................ | 359/820 |

* cited by examiner

*Primary Examiner*—Loha Ben
(74) *Attorney, Agent, or Firm*—Morgan & Finnegan, LLP (57) ABSTRACT

An optical element holder for holding an optical element includes a holding element to hold the optical element or a holding part provided to the optical element unitedly, wherein there is substantially no heat exchange between the optical element and the holding element or the holding part and the holding element.

11 Claims, 10 Drawing Sheets

OPTICAL ELEMENT HOLDER, EXPOSURE APPARATUS, AND DEVICE FABRICATING METHOD

This application is a divisional of U.S. patent application Ser. No. 10/844,919 filed on May 12, 2004 now U.S. Pat. No. 7,054,079.

This application claims priority benefit under 35 U.S.C. § 119 based on Japanese Patent Application No. 2003-135930 filed on May 14, 2003 and Japanese Patent Application No. 2004-114013 filed on Apr. 8, 2004, which are hereby incorporated by reference herein in their entirety as if fully set forth herein.

BACKGROUND OF THE INVENTION

The present invention relates generally to holding apparatuses, and more particularly to a holder for holding an optical element used in an exposure apparatus that exposes an object such as a single crystal plate for a semiconductor wafer or a glass plate for a liquid crystal display ("LCD"). The present invention is particularly suitable, for example, for a holder for holding an optical element used in an exposure apparatus that uses ultraviolet light or extreme ultraviolet light ("EUV") as an exposure light source.

To transfer the circuit pattern, a reduction projection exposure apparatus, which uses a projection optical system, has conventionally been employed to project a circuit pattern formed on a mask ("reticle") onto a wafer, etc, when manufacturing fine semiconductor devices such as a semiconductor memory or a logic circuit with photolithography technology.

The minimum critical dimension to be transferred by the projection exposure apparatus or resolution is proportionate to a wavelength of light used for exposure and inversely proportionate to the numerical aperture ("NA") of the projection optical system. Therefore, the shorter the wavelength, the better the resolution. Along with recent demands for finer semiconductor devices, shorter wavelengths of ultraviolet light, from an ultra-high pressure mercury lamp (i-line with a wavelength of approximately 365 nm) to KrF excimer laser (with a wavelength of approximately 248 nm) and ArF excimer laser (with a wavelength of approximately 193 nm), has been proposed.

However, lithography using ultraviolet light has limitations when it comes to satisfying the rapidly promoted fine processing of semiconductor devices. Therefore, to efficiently transfer a very fine circuit pattern of 100 nm or less, a reduction projection optical system using extreme ultraviolet ("EUV") light with a wavelength of 10 to 15 nm shorter than that of ultraviolet has been developed.

However, as the wavelength of the exposure light becomes shorter, the light absorption in a material increases remarkably. Thus, this makes it difficult to use a refraction element or lens used for visible light and ultraviolet light. In addition, no glass material exists for the EUV light's wavelength range. Furthermore, a reflection-type or catoptric optical system uses only a reflective element or mirror (for example, a multilayer mirror).

Therefore, the mirror does not reflect all the exposure light, but absorbs 30% or more of the exposure light. The absorbed exposure light causes residual heat, deforms the surface shape of the mirror, and deteriorates its optical performance, in particular, imaging performance. Therefore, the mirror is made of a low thermal expansion glass, for example, one having a coefficient of linear expansion of 10 ppb, so as to reduce a mirror's shape change as the temperature changes.

The EUV exposure apparatus, used for exposure of a circuit pattern of 0.1 μm, has strict critical dimension accuracy requirements. Therefore, the permitted mirror's surface shape deformation is only about 0.1 nm or less. As a result, even a mirror with a coefficient of linear expansion of 10 ppb would cause a gradual temperature rise and change the mirror's surface shape. For example, when the mirror has a thickness of 50 mm, a temperature rise of 0.2° C. changes the mirror's surface shape by 0.1 nm. Therefore, the mirror in the EUV exposure apparatus should be maintained at a very precise, constant temperature.

However, to prevent reflectance decrease caused by contaminations adhering to the surface of the mirror due to reactions of residual gas (high polymeric organic gas, etc.) contained in the exposure light path with the EUV light, the EUV exposure apparatus maintains its exposure light path in a high vacuum atmosphere of approximately $1 \times 10^{-6}$ Pa. Accordingly, the mirrors are cooled by thermal conduction or heat radiation, instead of convection like a gas blow.

Figure 9A:
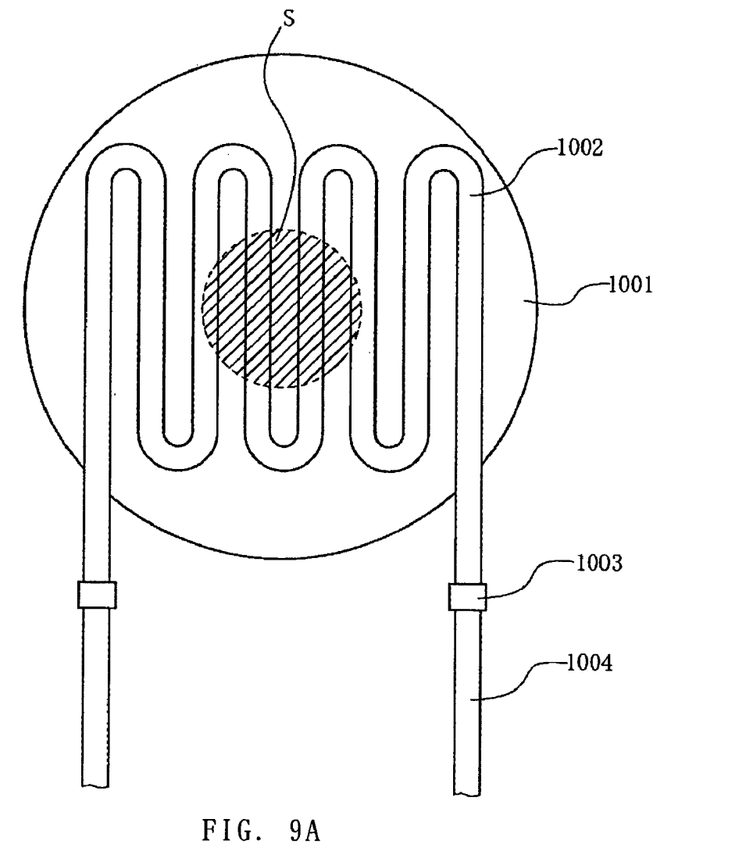
FIG. 9 is a schematic structure of a mirror cooling apparatus using liquid or gas as a coolant.
Figure 9B:
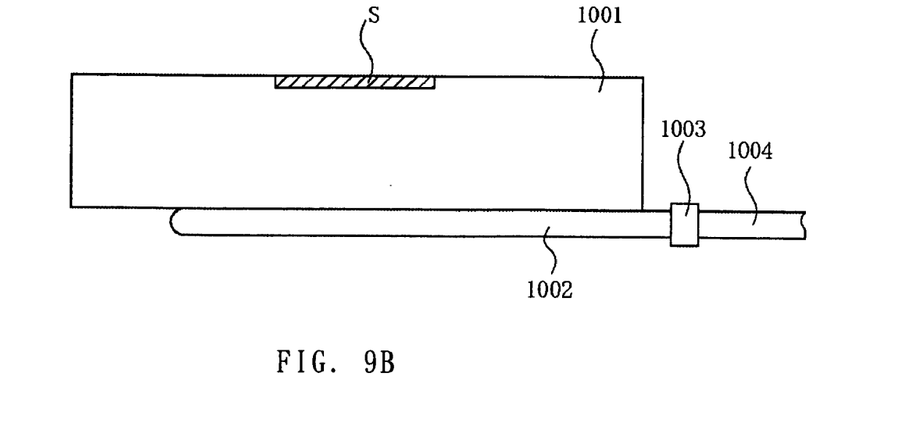
Figure 10:
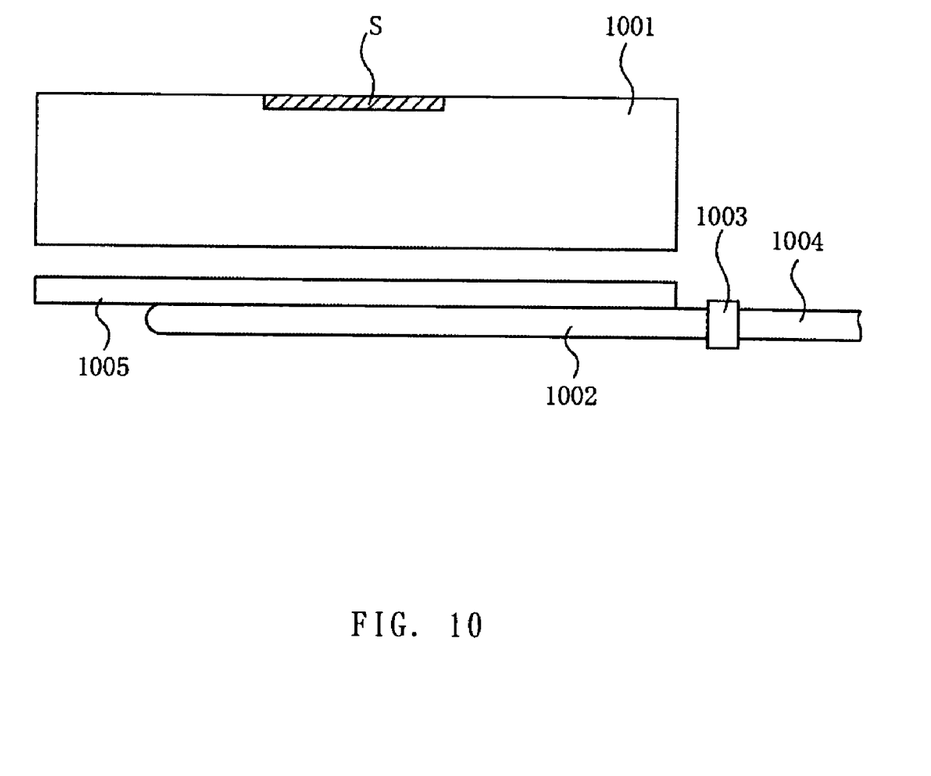
FIG. 10 is a schematic structure of a mirror cooling apparatus using heat transfer by radiation.

FIG. 9 shows a schematic structure of a mirror cooling apparatus using a liquid or a gas as a coolant. FIG. 9A is a bottom view of the mirror cooling apparatus. FIG. 9B is a side view of the mirror cooling apparatus. Numerical reference 1001 is a mirror formed from a low thermal expansion glass with a low coefficient of thermal conductivity. Numerical references 1002 is a pipe for flowing the coolant, 1003 is a joint for connecting the pipe 1002 to a flow path 1004 (explained after), and 1004 is the flow path to inflow the coolant into the pipe 1002. The pipe 1002 contacts the backside of the mirror 1001. The mirror cooling apparatus cools the mirror 1001 by thermal conduction heat transfer with the coolant that flows in the pipe 1002. Therefore, the mirror's 1001 temperature rise can be controlled. FIG. 10 is a schematic structure of a mirror cooling apparatus using heat transfer by radiation. The pipe 1002 is arranged to a radiation plate 1005 that has an area equal to a bottom surface of the mirror 1001. By using radiation heat transfer between the mirror 1001 and the radiation plate 1005, the mirror cooling apparatus can cool the mirror 1001, control the mirror's 1001 temperature rise, prevent conduction of vibration from the pipe to the mirror, and control the deterioration of optical performance.

A projection optical system uses a plurality of optical elements such as mirrors or lenses in the exposure apparatus. Japanese Patent Publication Application No. 2001-343576 discloses an optical element holder which fixes the optical element to a holding element by supporting the optical element elastically at three points. It can hold the optical element without overstressing, and therefore, decrease the optical element's deformation generated from temperature change or during assembly.

The optical element's temperature rises when it absorbs part of the exposure energy. However, because a conventional holding apparatus cannot withdraw all of the heat from the optical element to the cooling apparatus, but conducts a part of the heat to the holding element via a connection part, the desired optical performance cannot be acquired since the temperature distribution of the optical element will be uneven.

In a case, like that disclosed in Japanese Patent Publication Application No. 10-206714, where the holding apparatus holds the optical element by the holding element, using a linear motor, etc., without contact, the heat is transferred by radiation despite the vacuum state. However, as explained before, the temperature distribution of the optical element will be uneven, particularly due to the heat generation of the linear motor's coil.

BRIEF SUMMARY OF THE INVENTION

Accordingly, it is an exemplary object to provide optical element holders that prevents generation of uneven temperature distribution in an optical element, which causes a deterioration of imaging performance. It is also an exemplary object to provide an optical element holder that can maintain a more constant temperature distribution than conventional optical element holders.

An optical element holder for holding an optical element of one aspect according to the present invention includes a holding element to hold the optical element or a holding part provided to the optical element unitedly, wherein there is substantially no heat exchange between the optical element and the holding element or the holding part and the holding element.

An exposure apparatus of another aspect according to the present invention includes an optical element, an optical element holder for holding the optical element which includes a holding element to hold the optical element or a holding part integrated with the optical element, wherein there is substantially no heat exchange between the optical element and the holding element or the holding part and the holding element, and an optical system for guiding light from a light source to an object, wherein the optical system includes the optical element.

An exposure apparatus of still another aspect according to the present invention includes an optical system for guiding light from a light source, wherein the optical system includes the optical element; a holding element for holding the optical element or a holding part provided to the optical element unitedly, wherein the holding element includes an elastic element which has an elasticity in a radial direction of the optical element; a first temperature sensor for detecting a temperature of the optical element and/or a temperature of the holding part; a second temperature sensor for detecting a temperature of the holding element; and a first temperature controller for controlling, in accordance with a detected result of the first temperature sensor, the temperature of the optical element at a specific target temperature by radiation, wherein there is substantially no heat exchange between the optical element and the holding element or the holding part and the holding element.

A device fabrication method of still another aspect according to the present invention includes the steps of exposing an object by using an exposure apparatus which includes an optical system for guiding light from a light source, wherein the optical system includes the optical element; a holding element for holding the optical element or a holding part provided to the optical element unitedly, wherein the holding element includes an elastic element which has an elasticity in a radial direction of the optical element; a first temperature sensor for detecting a temperature of the optical element and/or a temperature of the holding part; a second temperature sensor for detecting a temperature of the holding element; and a first temperature controller for controlling the optical element's temperature, in accordance with a detected result of the first temperature sensor, at a specific target temperature by radiation; wherein there is substantially no heat exchange between the optical element and the holding element or the holding part and the holding element, and developing the object that has been exposed.

Other objects and further features of the present invention will become readily apparent from the following description of the preferred embodiments with reference to accompanying drawings.

DETAILED DESCRIPTION OF THE PREFERRED EMBODIMENTS

Referring now to the accompanying drawings, a description will now be given of an optical element holder of the embodiments according to the present invention.

The First Embodiment

FIG. 1 and FIG. 2 show an optical element holder of the first embodiment according to the present invention.

Figure 1A:
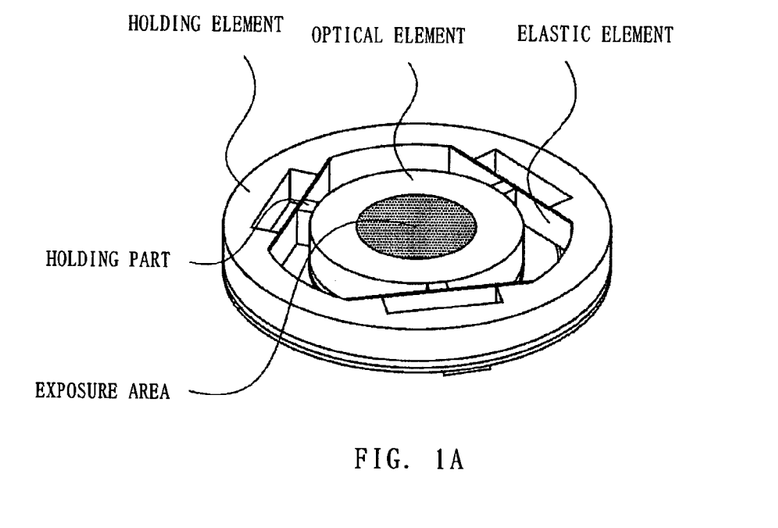
FIG. 1 is an explanation view of the first embodiment according to the present invention.
Figure 1B:
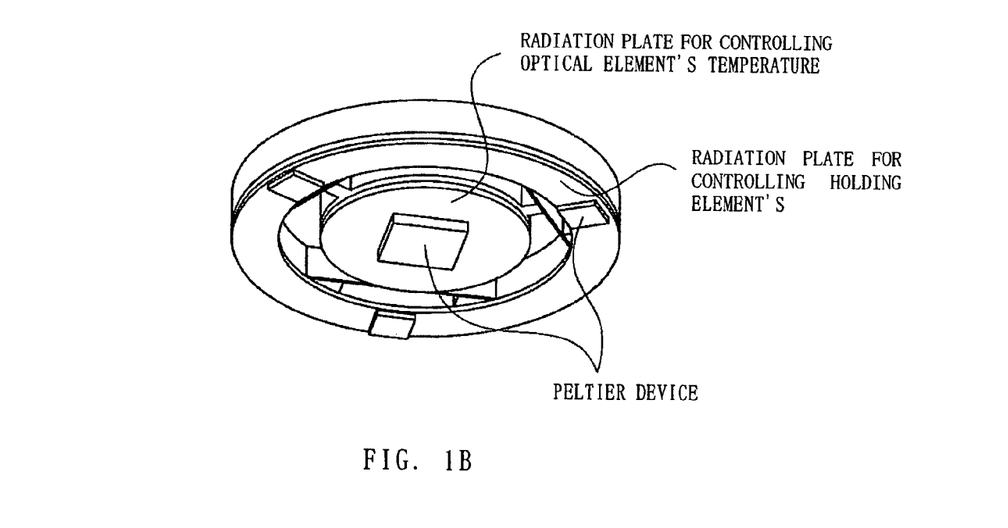
Figure 2A:
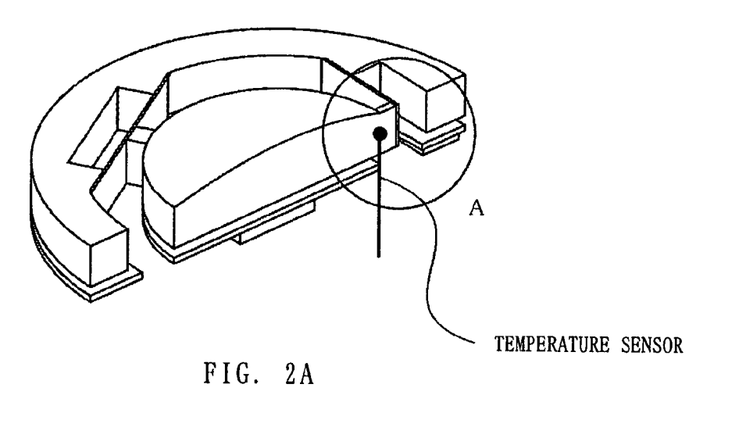
FIG. 2 is an explanation view of the first embodiment according to the present invention.
Figure 2B:
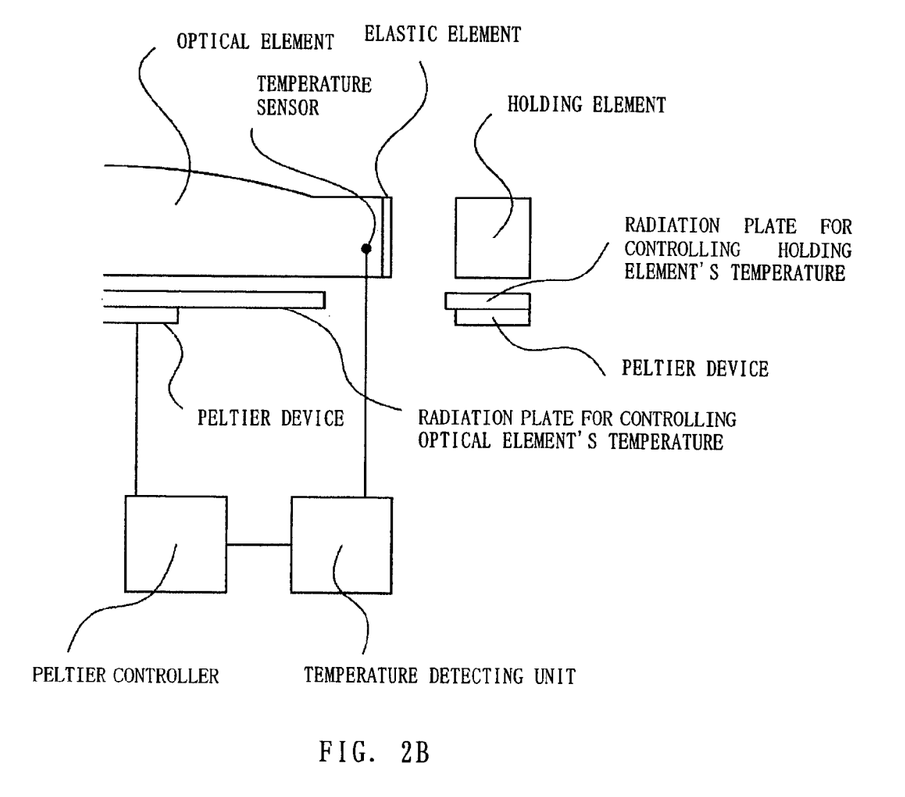

FIG. 1A is a view from an exposure area side, FIG. 1B is a bottom view, FIG. 2A is a sectional view along the optical element's center, and FIG. 2B is an enlarged view of portion A in FIG. 2A.

The optical element is engaged via a holding part to an elastic element that is fixed to a holding element. The holding part may be part of the optical element or another element provided to the optical element unitedly. The holding part is preferably united to the optical element mechanically or adhered to the optical element by adhesive. However, it may be nearly united, for example, it may have a structure that is approximately united to the optical element due to gravity and friction by the gravity. The holding part and the elastic element may be connected mechanically or adhered by the adhesive. However, an adhesive with little outgas in vacuum state should be used.

The elastic element, with a low elasticity in the radial direction, includes a flat spring. The thermal expansion of the optical element with absorption of the exposure energy can uniformly deform the elastic element. The elastic element (not necessarily a flat spring), except in the radial direction, preferably has high rigidity. It also does not shift position in the optical axial direction if the optical element expands from heat.

A radiation plate for controlling the optical element's temperature is arranged to the bottom side of the optical element (i.e. the backside of the mirror's reflection surface). Using the radiation plate as the optical element's temperature control, the temperature of the optical element is maintained at a specific temperature (a target temperature, within ±0.3° C. of a target temperature, or more preferably within ±0.1° C. of a target temperature). A Peltier device or the like can then be used to control the temperature of the radiation plate. In cases where the Peltier device is used, the preferable arrangement of a temperature maintaining element (not shown) which is maintained at a constant temperature, is on a side of the Peltier device opposite to the radiation plate. Here, as shown in FIG. 2B, the Peltier devices are arranged so that they contact the radiation plates (radiation elements). However, the Peltier devices may be arranged away from the radiation plates, or arranged partially spaced from the radiation plates. Also, to reduce a temperature change (preferably, to prevent a temperature change) of the optical element by the heat radiation from the Peltier devices, the areas of the radiation plates respectively facing the Peltier devices are preferably larger than the areas of the Peltier devices respectively facing the radiation plates. The temperature maintaining element has it's own flow path to flow and exchange the heat with the coolant so as to maintain the temperature of element at a substantially constant temperature (the temperature change of the temperature maintaining element should be within ±0.3° C., or more preferably within ±0.1° C.). The temperature of the temperature maintaining element should be within ±2° C. of the optical element's target temperature. It should preferably be within ±0.5° C. of the target temperature of the optical element, or more preferably 22° C. to 24° C. Using the coolant or the like to control the optical element's temperature control, may control the temperature of the radiation plate.

Arranged on the bottom side of the holding element is a radiation plate for controlling the holding element's temperature. Similar to controlling the radiation plate for controlling the optical element's temperature, a Peltier device or the like can control the temperature of the radiation plate for controlling the holding element's temperature. Provided on the backside of the Peltier device is a temperature maintaining element. This temperature maintaining element may be in common with the temperature maintaining element arranged near the backside of the radiation plate for controlling the optical element's temperature. This embodiment arranges a plurality of the Peltier devices evenly around the circumference of the optical axis of the optical element, uniformly maintains the temperature of the radiation plate for controlling the holding element's temperature, and can substantially maintain the temperature of the whole holding element uniformly (within an accuracy of ±2° C., or preferably within ±0.5° C.).

The radiation plate uses a relatively low coefficient of thermal conductivity material like ceramics such as aluminum oxide or silicon carbide, or metals such as copper or aluminum. Because it controls the temperature of the optical element by thermal conduction of radiation, the radiation plate should preferably have high emissivity on the surface facing the optical element. The optical element uses a low expansion glass ceramic whose emissivity is approximately 0.9 (0.8 or more, preferably 0.9 or more). Generally, a metal with a smooth surface has low emissivity. Therefore, it is preferable to improve the emissivity of the radiation plate by surface treating the surface of the radiation plate facing the optical element. A temperature sensor is provided in a holding part of the optical element. The optical element holder, using the temperature sensor to a Peltier controller which controls current and voltage of the Peltier device, can input the result of the temperature detected by a temperature detecting unit and can control the Peltier device which controls the temperature of the radiation plate for controlling the optical element's temperature. The temperature sensor is not limited of being provided in the holding part. It may be arranged either with or without contact to the holding part.

This embodiment maintains the temperature of the holding element at a specific standard temperature which is approximately constant, detects the temperature of the holding part with the temperature sensor, and controls the temperature of the radiation plate for controlling the optical element's temperature so that the temperature of the holding part of the optical element becomes the same as the standard temperature. Therefore, the optical element can be the same temperature as the holding element, does not transfer heat to the holding element, and can maintain its temperature distribution uniformly. The temperature difference between the holding part and the holding element is decided by the allowance of 1 W of the heat difference exchanged between the holding part and the holding element with each other, the physical properties such as a coefficient of thermal conductivity of a structure provided between the holding part and the holding element, the sectional area of the structure, the distance from the holding part to the holding element via the structure, and the temperature difference between the holding part and the holding element. Concretely, in cases where the amount of heat exchange allowance is 1 W, which is approximately the same as the exposure energy absorption of the optical element, the temperature difference $\Delta T$ will be decided so as to satisfy:

$$\Delta T \times \lambda \times (\text{the sectional area of the structure}/L) < 1 \text{ W},$$

where $\lambda$ is the coefficient of thermal conductivity of the structure and L is the distance from the holding part to the holding element via the structure.

The calculation can still be executed when the sectional area or the structural material is changed near the heat conduction's halfway area. The maximum allowable value of $\Delta T$ can be calculated based on the condition of this equation. However, $\Delta T$ should be 0.3° C. or less, preferably 0.1° C. or less. This is suitable for the case where a little temperature change in the optical element is allowable.

When the temperature change (i.e. the shift from the target temperature) of the optical element greatly influences the optical performance of the optical element or the optical performance of the optical system including the optical element, the temperature of the optical element should be maintained in the target temperature (within ±0.3° C. of the target temperature, preferable within ±0.1° C. of the target temperature). In this case, the radiation plate's temperature for controlling the holding element's temperature is controlled so that the holding element's temperature meets the temperature of the holding part. It is decided by controlling the temperature of the radiation plate for controlling the optical element's temperature and the temperature of the optical element at the target temperature. Thus, there can be substantially no heat exchange between the optical element and the holding element. Despite actually transferring heat, this is a balance state of giving and taking of heat with each other. When the optical element absorbs the exposure energy constantly in the exposing environment of this embodiment, a temperature measurement system such as the temperature sensor and the temperature detecting unit can be omitted if the temperature of the holding element and the optimum temperature of the radiation plate for controlling the optical element's temperature and the radiation plate for controlling the holding element's temperature are known in advance through experiments or simulations. Instead of a Peltier device, as in this embodiment, the temperature control of the radiation plate can use a cooling pipe or air-cooling.

The Second Embodiment

Figure 3A:
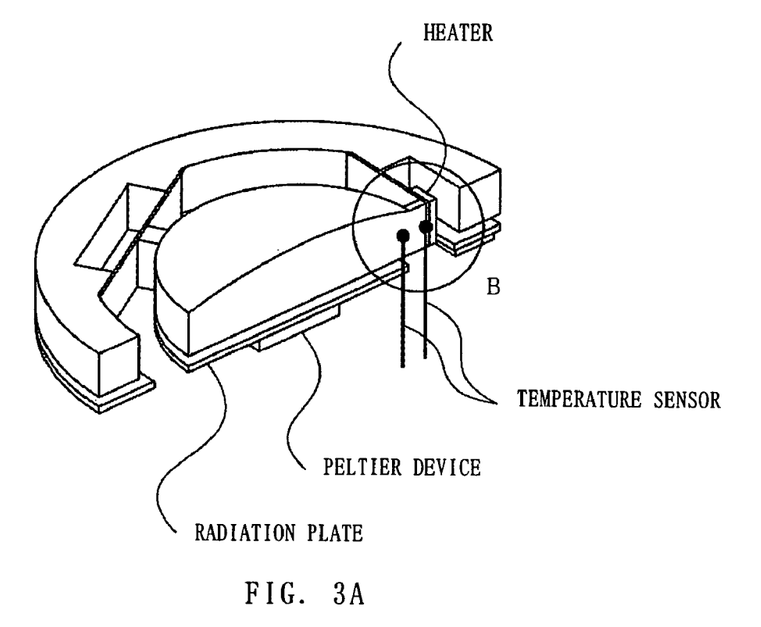
FIG. 3 is an explanation view of the second embodiment according to the present invention.
Figure 3B:
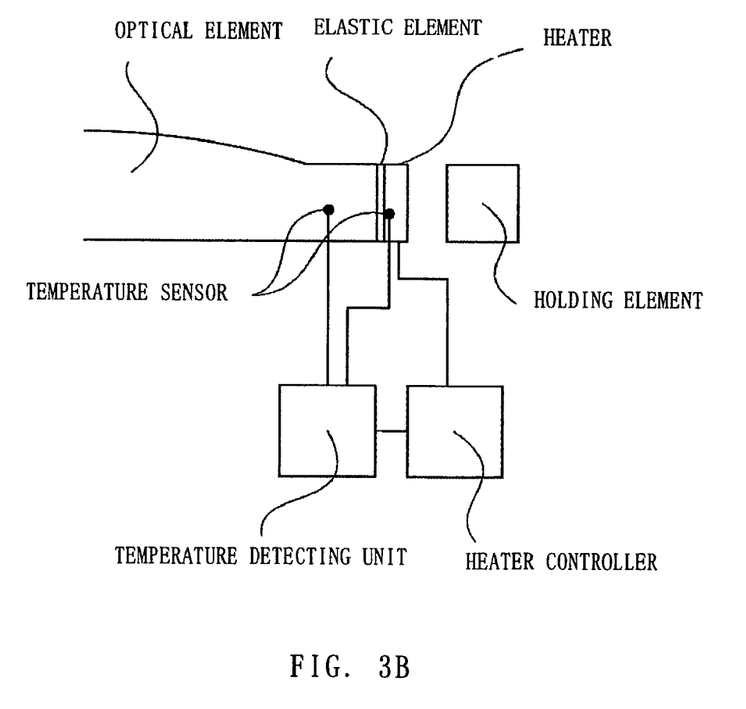

FIG. 3 shows an optical element holder of the second embodiment according to the present invention. FIG. 3A is a sectional view at a center of the optical element. FIG. 3B is an enlarged view of portion B shown in FIG. 3A. The radiation plate for controlling the optical element's temperature and the Peltier device are not shown but have the same functions as in the first embodiment.

Instead of a radiation plate as in the first embodiment, this embodiment uses a heater for controlling the holding element's temperature. The heater is arranged on an elastic element side, near a connection part, of the holding part and the elastic element (the holding element). Moreover, temperature sensors are arranged on both the elastic element side and on a holding part side, near the connection part, of the holding part and the elastic element.

Because this embodiment uses the temperature sensors to detect the temperatures of two portions in both sides of the connection part and controls the two detected temperatures so that they are equal, there are no temperature gradient on the connection part of the holding part and the elastic element (the holding element), no heat transfer from the optical element to the holding element, and the temperature distribution of the optical element can be uniformly maintained.

The optical element as a heat source generates heat by absorbing the exposure energy. Therefore, the temperature gradient appears lower at the holding element than at the optical element. However, instead of the heater used in this embodiment, the temperature control can use the Peltier device, etc.

The Third Embodiment

Figure 4A:
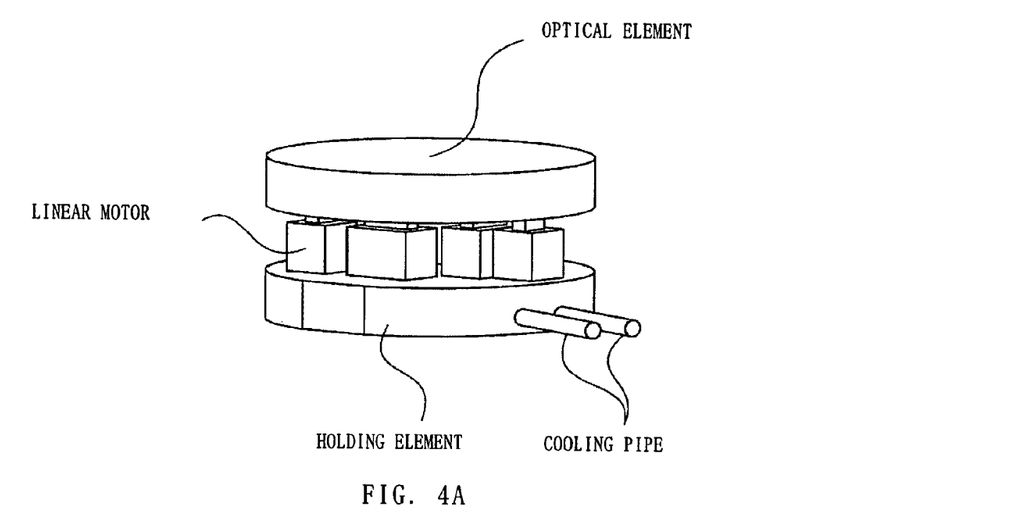
FIG. 4 is an explanation view of the third embodiment according to the present invention.
Figure 4B:
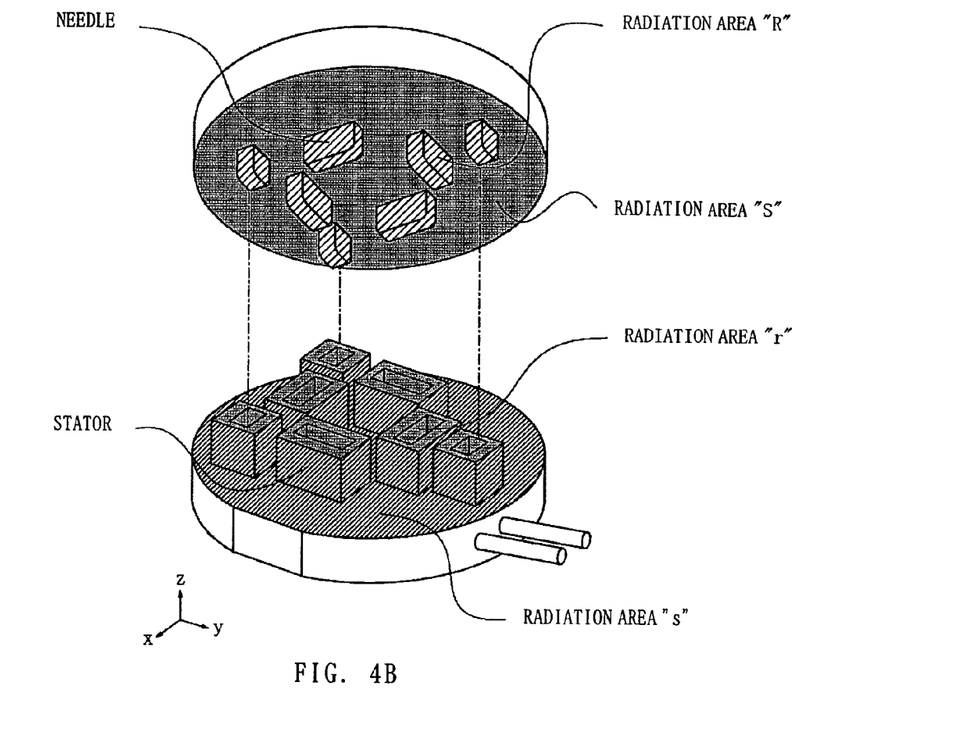

FIG. 4 shows an optical element holder of the third embodiment according to the present invention. FIG. 4A shows the holding element which holds the optical element via a linear motor without contact. FIG. 4B is a developmental view of the optical element and the holding element shown in FIG. 4A.

In this embodiment, the holding element holds the optical element via the linear motor without contact. A cooling pipe, provided in the holding element, maintains the holding element at constant temperature.

The linear motor uses needles and stators in pair. In this embodiment, the linear motors uses two pairs of needles and stators for the x direction, two pairs for the y direction, and three pairs for the z direction. Relative to the holding element, this can drive the optical element in six directions along the x, y, and z axes and along the rotational directions around the x, y, and z axes.

Heat generated by the optical element from absorption of the exposure energy and heat generated by an electric coil in the stator becomes heat sources. Despite not contacting, the stator and needle transfers heat with each other by radiation. As a result, without any heat insulation, the temperature distribution of the optical element becomes uneven. This embodiment covers, with gold, silver, copper, or aluminum, or metal alloy of gold, silver, copper, or aluminum, the surfaces of a radiation area R of the needle on the side of a movable portion including the optical element, a radiation area r facing the radiation area R on the side of a fixed portion, a radiation area S which approximately covers the whole surface of the backside of the optical element on the side of the movable portion, and a radiation area s facing the radiation area S on the side of the fixed portion. The amount of heat transfer Q between two surfaces can be described with the emissivity $\varepsilon 1$ and $\varepsilon 2$ of two surfaces.

$$1/Q \propto \frac{\varepsilon 1 + \varepsilon 2}{\varepsilon 1 \cdot \varepsilon 2} - 1$$

In this embodiment, the emissivity of gold, silver, copper, or aluminum with a smooth surface can be 0.05 or less. The amount of heat transfer can be 1/39 or relatively less when $\varepsilon 1$ and $\varepsilon 2$ are equal to 1. Therefore, the heat transfer between the optical element and the holding element can be decreased and the temperature distribution of the optical element can be uniformly maintained.

The material for the radiation area is not limited to gold, silver, copper, or aluminum. The radiation area can use any material which has emissivity of 0.05 or less.

The Fourth Embodiment

Figure 5A:
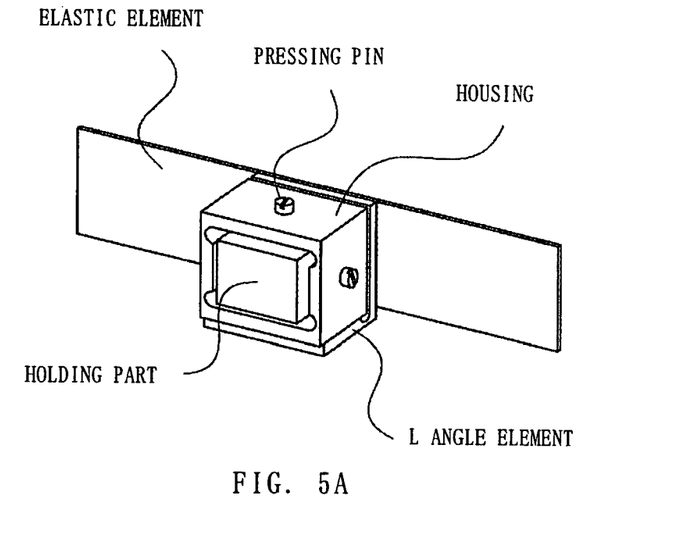
FIG. 5 is an explanation view of the fourth embodiment according to the present invention.
Figure 5B:
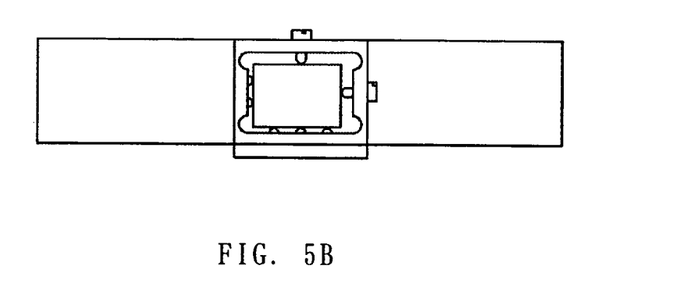
Figure 5C:
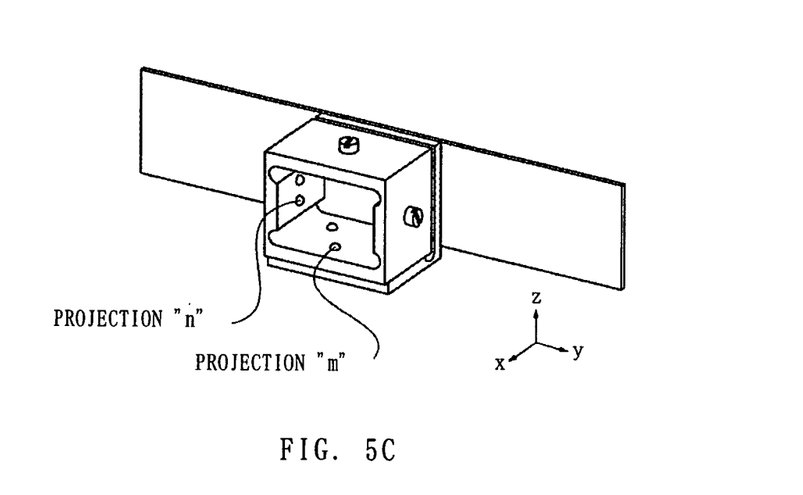

FIG. 5 shows an optical element holder of the fourth embodiment according to the present invention. FIG. 5A shows a connection part, in the holding part of the optical element, in the optical element holder of this embodiment. FIG. 5B is a view from the optical element side of the connection part shown in FIG. 5A. FIG. 5C is an explanation view of this embodiment without the connection part shown. An adhesive with no outgas in vacuum state, a screw, or the like fixes the elastic element to an L angle element. A housing (the holding element) is fixed to the L angle element in the same way. The elastic element uses a flat spring which has low elasticity in the optical element's radial direction.

The L angle element, with a flat springy structure at its folded portion, has low elasticity in the rotational direction around the y axis. Preferably, except for the rotational direction around the y axis, the L angle element has high rigidity in the other five directions. Particularly, the rigidity in the other five directions should be higher than that in the rotational direction around the y axis, and preferably ten times higher than that in the rotational direction around the y axis.

The housing has a flat springy structure at its four sides with the z-x plane and low elasticity in the rotational direction around the x axis. Except for the rotational direction around the x axis, the housing should preferably have high rigidity in the other five directions. Particularly, the rigidity in the other five directions should be higher than that in the rotational direction around the x axis, and is preferably ten times higher than that in the rotational direction around the x axis.

The elastic element, the L angle element, and the housing use materials, such as invar, which has a coefficient of linear expansion substantially similar to that of the optical element. Differences in the coefficient of linear expansion between the optical element and the elastic element, the L angle element, or the housing should be less than 10%, preferably 5% or less. A plurality of projections m are arranged on the bottom housing's inside surface. The projections m, although not limited in arrangement, are preferably arranged at two portions of the bottom's center, along the x direction.

A plurality of projections n are arranged at two portions in the center of the inside surface of the housing sidewall, along the x direction.

The holding part of the optical element contacts the projections m and projections n. It is engaged to the housing by pressing pins upward and sideward.

The projections and the pressing pins use materials of metal, ceramics, or the like.

In the fourth embodiment, as the projection engages the holding part of the optical element, the contact area of the connection part which connects the holding part of the optical element with the housing is small, and the thermal resistance of the connection part can rise. Therefore, heat transfer between the optical element and the holding element can be decreased, and the temperature distribution of the optical element can be maintained uniformly. The contact area of the holding part with the housing should be 1% of the reflection surface of the mirror or less (refraction surface of the lens, diffraction surface of the diffraction optical element), or preferably be 0.1% or smaller. The temperature should be controlled to satisfy the equation of:

(contact area)/(reflection surface area of the optical element)×(temperature difference between the holding part and the housing)<0.01 (more preferably, 0.001).

The first to fourth embodiments substantially eliminate the heat exchange between the optical element or the holding part fixed to the optical element unitedly and the holding element which holds the holding part so that uneven temperature distribution in the optical element decreases. Methods for substantially eliminating heat exchange can use low coefficient of thermal conductivity material (thermal insulating material), such as 0.3 W/(m·K) or more preferably 0.05 W/(m·K), between the holding part and the holding element. For example, the radiation plate and the heater for controlling the holding element and the elastic element can be removed from the first and second embodiments. They can then use a low coefficient of thermal conductivity material as the material of the elastic element.

Here, a state where there is substantially no heat exchange is preferable to a state where the heat exchange is approximately equal to the amount of exposure energy absorbed by the optical element. Preferably, the heat exchange between the holding part and the holding element is 1 W or less (more preferably 0.1 W or less).

The optical element holder explained above can control the heat transfer between the optical element and the holding element for holding the optical element. It can also even the temperature distribution of the optical element and decrease optical performance deterioration caused by the unevenness of the optical element's temperature.

Figure 6A:
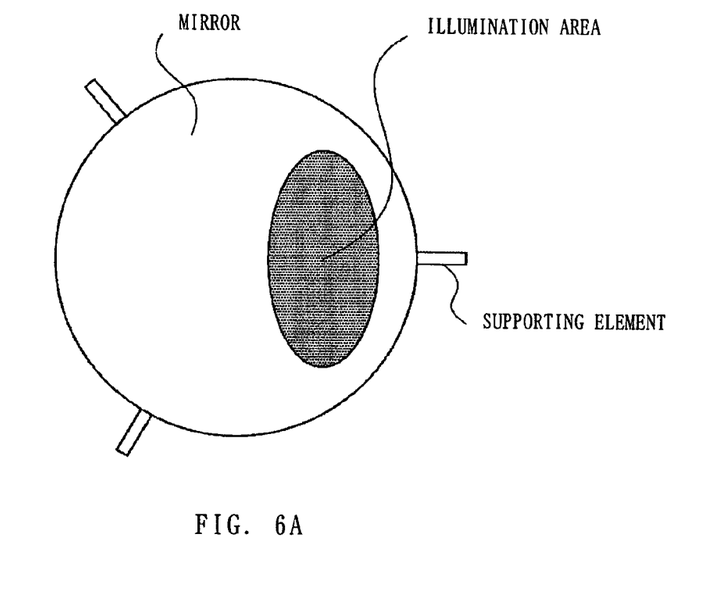
FIG. 6 is an explanation view of a mirror in a projection optical system.
Figure 6B:
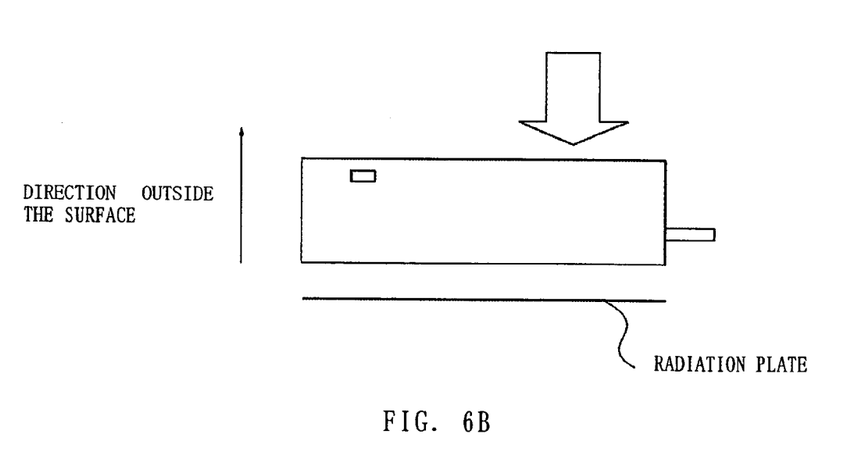

A semiconductor exposure apparatus or the like including a projection optical system or an illumination optical system, which has the optical element holder according to the present invention can expose with stability and small aberration, and can manufacture fine semiconductors or display devices with high resolution transfer. Meanwhile, FIG. 6 is an explanation view showing a mirror used in a projection optical system supported with three points. A supporting element shown in FIG. 6 corresponds to the holding part in the embodiments. EUV light illuminates an illumination area of the mirror, which absorbs 30% of the EUV light and raises its temperature. A radiation plate cools the mirror and controls the temperature rise of the mirror, thus, preventing uneven temperature on the mirror (decreases the unevenness of the temperature distribution of the mirror). Still, the unevenness means there is a shift in temperature distribution in the rotational direction of the mirror around the optical axis.

Figure 7:
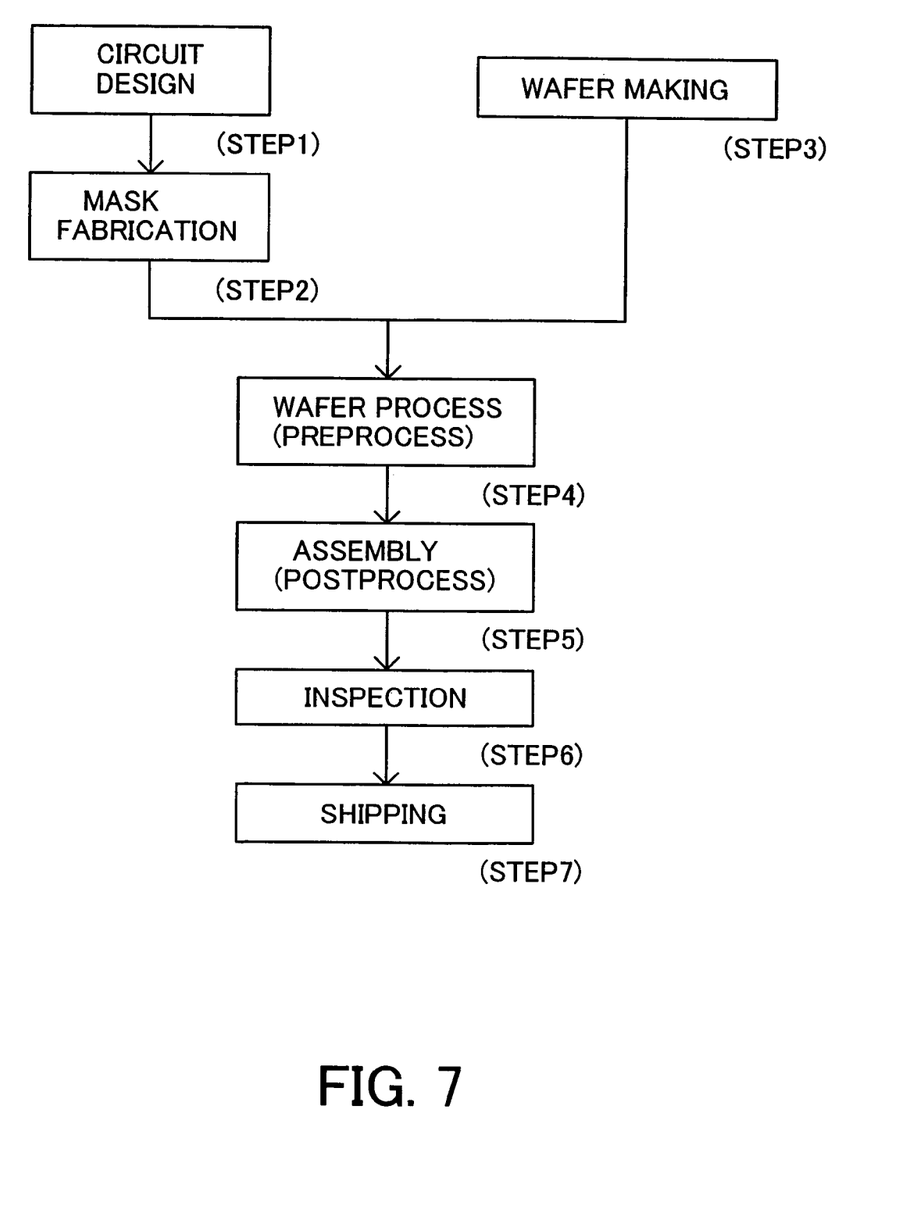
FIG. 7 is a flowchart for explaining a method for fabricating devices such as semiconductor chips.
Figure 8:
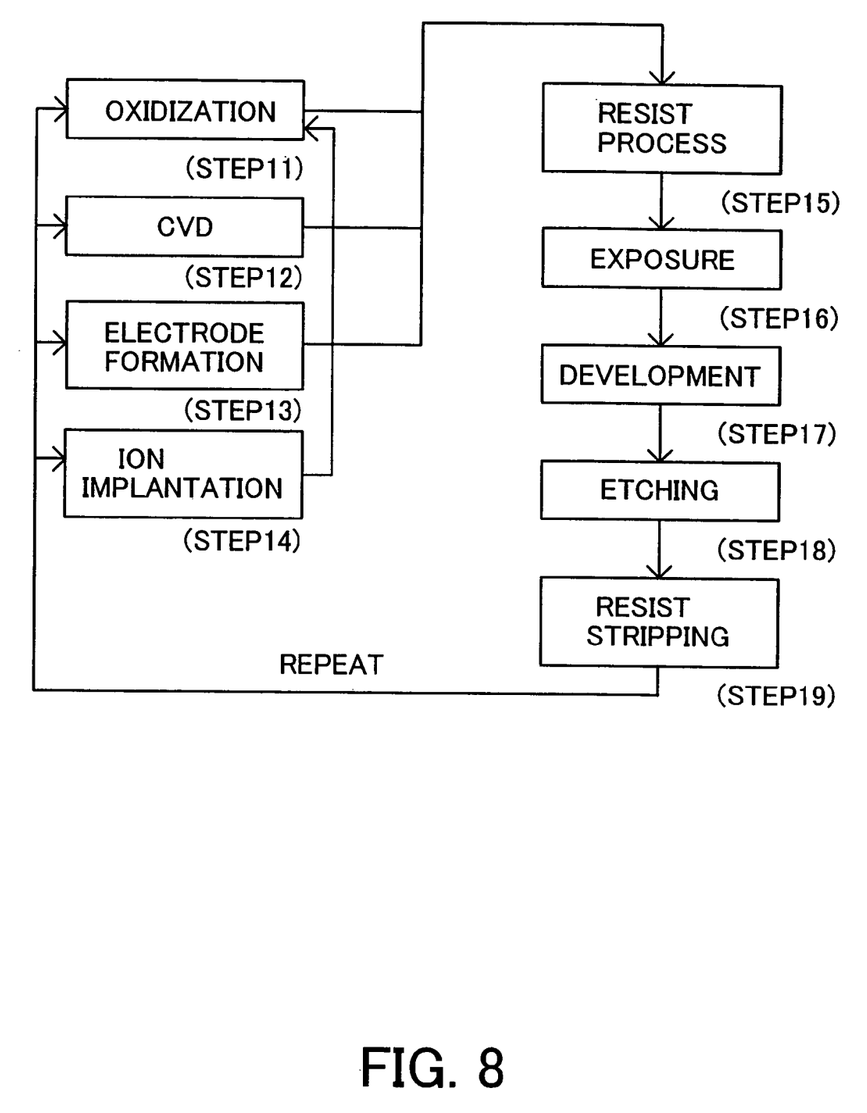
FIG. 8 is a detailed flowchart for the wafer process shown in FIG. 7.

Referring now to FIGS. 7 and 8, a description will be given of an embodiment of a device fabricating method using the above exposure apparatus. FIG. 7 is a flowchart for explaining fabrication of devices (i.e., semiconductor chips such as IC and LSI, LCDs, CCDs, etc.). Here, as an example, a description will be given of a semiconductor chip fabrication. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), referred to as a pretreatment, uses the mask and wafer to form the actual circuitry on the wafer through photolithography. Step 5 (assembly), also referred to as a posttreatment, forms the wafer from Step 4 into a semiconductor chip and includes an assembly step (e.g., dicing, bonding), a packaging step (chip sealing), and the like. Step 6 (inspection) performs various tests on the semiconductor device made in Step 5, such as validity test and durability test. Through these steps, a semiconductor device is finished and shipped (Step 7).

FIG. 8 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus to expose a circuit pattern on the mask onto the wafer. Step 17 (development) develops the exposed wafer. Step 18 (etching) etches parts other than a developed resist image. Step 19 (resist stripping) removes unused resist after etching. These steps are repeated to form multilayer circuit patterns on the wafer. The device fabrication method of this embodiment may manufacture higher quality devices than the conventional method. Accordingly, the device fabricating method and the devices as products are also within the scope of the present invention.

Further, the present invention is not limited to these preferred embodiments, and various variations and modifications may be made without departing from the scope of the present invention. For example, the present invention is applicable to an exposure apparatus which has an optical system with an eccentric exposure area to an optical axis.

Scope 1. An optical element holder for holding an optical element comprising a holding element to hold the optical element or a holding part provided to the optical element unitedly, wherein there is substantially no heat exchange between the optical element and the holding element or the holding part and the holding element.

Scope 2. The optical element holder according to scope 1, wherein a difference between the heat transfer from the holding part to the holding element and the heat transfer from the holding element to the holding part is 1 W or smaller.

Scope 3. The optical element holder according to scope 1, wherein a contact area of the optical element to the holding element or the holding part to the holding element is 1% or less than an optical area of the optical element.

Scope 4. The optical element holder according to scope 1, wherein a contact area of the optical element to the holding element or the holding part to the holding element is 0.1% or less than an optical area of the optical element.

Scope 5. The optical element holder according to scope 1, wherein a difference between a temperature of the holding part and a temperature of the holding element is 0.3 degree centigrade or smaller.

Scope 6. The optical element holder according to scope 1, wherein a difference between a temperature of the holding part and a temperature of the holding element is 0.1 degree centigrade or smaller.

Scope 7. The optical element holder according to scope 1, wherein the holding part includes an elastic element whose rigidity in a direction along a radial direction of the optical element is lower than rigidities in directions along any of five other axes.

Scope 8. The optical element holder according to scope 1, wherein the holding part includes an elastic element whose rigidity in a direction along a radial direction of the optical element is 1% or lower than rigidities in directions along any of five other axes.

Scope 9. The optical element holder according to scope 1, further comprising a first temperature controller for controlling a temperature of the optical element by radiation.

Scope 10. The optical element holder according to scope 9, wherein the first temperature controller includes:
a first radiation element facing the optical element,
a Peltier device arranged near or on a side of the first radiation element opposite to the optical element; and
a controller for controlling the Peltier device.

Scope 11. The optical element holder according to scope 9, wherein the first temperature controller includes:
a first radiation element facing the optical element,
a first temperature sensor for detecting a temperature of the optical element and/or a temperature of the holding part,
a Peltier device arranged near or on a side of the first radiation element opposite to the optical element,
a temperature maintaining element arranged near or on a side of the Peltier device opposite to the first radiation element; and
a controller for controlling the Peltier device in accordance with a detected result of the first temperature sensor so that the temperature of the optical element is substantially at a specific target temperature,
wherein the specific target temperature and the temperature of the temperature maintaining element are substantially the same.

Scope 12. The optical element holder according to scope 1, further comprising:
a second radiation element facing the holding element and/or a second temperature controller for controlling a temperature of the holding element using an electric heater,
a first temperature sensor for detecting a temperature of the optical element and/or a temperature of the holding part,
a second temperature sensor for detecting a temperature of the holding element; and
a controller for controlling the second temperature controller in accordance with detected results of the first temperature sensor and the second temperature sensor.

Scope 13. An exposure apparatus comprising:
an optical element,
an optical element holder for holding the optical element which includes a holding element to hold the optical element or a holding part integrated with the optical element, wherein there is substantially no heat exchange between the optical element and the holding element or the holding part and the holding element; and
an optical system for guiding light from a light source to an object, said optical system includes the optical element.

Scope 14. A device fabricating method comprising the steps of:
exposing an object by using an exposure apparatus which includes an optical element, an optical element holder for holding the optical element which includes a holding element to hold the optical element or a holding part integrated with the optical element, wherein there is substantially no heat exchange between the optical element and the holding element or the holding part and the holding element, and an optical system for guiding light from a light source to an object, said optical system including the optical element; and
developing the object that has been exposed.

Scope 15. An exposure apparatus comprising:
an optical system for guiding light from a light source, said optical system includes the optical element,
a holding element for holding the optical element or a holding part provided to the optical element unitedly, said holding element including an elastic element which has an elasticity in a radial direction of the optical element,
a first temperature sensor for detecting a temperature of the optical element and/or a temperature of the holding part,
a second temperature sensor for detecting a temperature of the holding element; and
a first temperature controller for controlling, in accordance with a detected result of the first temperature sensor, the temperature of the optical element at a specific target temperature by radiation,
wherein there is substantially no heat exchange between the optical element and the holding element or the holding part and the holding element.

Scope 16. The exposure apparatus according to scope 15, wherein the first temperature controller includes:
a first radiation element facing the optical element,
a Peltier device arranged near or on a side of the first radiation element opposite to the optical element,
a temperature maintaining element arranged near or on a side of the Peltier device opposite to the first radiation element; and
a controller for controlling the Peltier device in accordance with a detected result of the first temperature sensor so that the temperature of the optical element is substantially in a specific target temperature.

Scope 17. The exposure apparatus according to scope 16, wherein the specific target temperature and the temperature of the temperature maintaining element are substantially the same.

Scope 18. A device fabricating method comprising the steps of:
exposing an object by using an exposure apparatus which includes an optical system for guiding light from a light source, said optical system including an optical element, a holding element for holding the optical element or a holding part provided to the optical element unitedly, said holding element including an elastic element which has an elasticity in the optical element's radial direction,
a first temperature sensor for detecting a temperature of the optical element and/or a temperature of the holding part,
a second temperature sensor for detecting a temperature of the holding element, and
a first temperature controller for controlling, in accordance with the detected result of the first temperature sensor, the temperature of the optical element at a specific target temperature by radiation,
wherein there is substantially no heat exchange between the optical element and the holding element or the holding part and the holding element; and
developing the object that has been exposed.

Scope 19. An optical element holder comprising a holding mechanism for a holding element to hold an optical element, wherein the holding mechanism has a heat shielding mechanism for preventing substantial heat exchange between the optical element and the holding element.

Scope 20. The optical element holder according to scope 19, wherein the heat shielding mechanism includes:
a temperature controller for the optical element; and
a temperature controller for the holding element.

Scope 21. The optical element holder according to scope 19, wherein the heat shielding mechanism includes:
a temperature controller for the optical element,
a temperature controller for the holding element; and
a temperature sensor provided near or on a holding part of the optical element.

Scope 22. The optical element holder according to scope 21, wherein a temperature of the holding element maintained by the temperature controller for the holding element and a temperature of the optical element controlled by the temperature controller for the optical element that is detected by the temperature sensor provided near or on the holding part of the optical element is the same as a temperature of the holding element.

Scope 23. The optical element holder according to scope 19, wherein the heat shielding mechanism includes:
a temperature sensor provided on a optical element side near or on the connection part of the optical element and the holding element,
a temperature sensor provided on a holding element side near or on the connection part of the optical element and the holding element; and
a temperature controller provided near or on the temperature sensor provided on the holding element side.

Scope 24. The optical element holder according to scope 23, wherein the temperature controller is an electric heater.

Scope 25. The optical element holder according to scope 23, wherein the temperature controller is a Peltier device.

Scope 26. The optical element holder according to scope 23, wherein the temperature controller controls a temperature of the optical element and a temperature of the holding element so that a temperature detected by the temperature sensor provided on an optical element side near or on the connection part of the optical element and the holding element, and a temperature detected by the temperature sensor provided on a holding element side near or on the connection part of the optical element and the holding element are the same.

Scope 27. The optical element holder according to scope 19, wherein the heat shielding mechanism includes a plurality of projection which mechanically connects the optical element and the holding element.

Scope 28. The optical element holder according to scope 19, wherein the optical element holder holds the optical element without the optical element contacting the holding element, and a part of the holding element closest to the optical element is made of gold, silver, copper, aluminum, or a metal alloy with at least any two metals of a gold, a silver, a copper, or an aluminum; or is metal plated by gold, silver, copper, aluminum, or a metal alloy with at least any two metals of a gold, a silver, a copper, or an aluminum.

Scope 29. An exposure apparatus comprising a projection optical system having a specific optical element held by an optical element holder which includes a holding mechanism for a holding element to hold the optical element, wherein the holding mechanism has a heat shielding mechanism for preventing substantial heat exchange between the optical element and the holding element, wherein the projection optical system projects a mask pattern onto a substrate.

Scope 30. A device fabricating method comprising the steps of:
exposing a substrate with a device pattern by using an exposure apparatus which includes a projection optical system having a specific optical element held by an optical element holder which includes a holding mechanism for a holding element to hold the optical element, wherein the holding mechanism has a heat shielding mechanism for preventing substantial heat exchange between the optical element and the holding element, wherein the projection optical system projects a mask pattern onto a substrate; and
developing the substrate that has been exposed.

What is claimed is:

1. An optical element holder for holding an optical element, said optical element holder comprising a holding element to hold the optical element or a holding part provided to the optical element unitedly,
wherein there is substantially no heat exchange between the optical element and the holding element or the holding part and the holding element, and
wherein a difference between the heat transfer from the holding part to the holding element and the heat transfer from the holding element to the holding part is 1 W or smaller.

2. The optical element holder according to claim 1, wherein a contact area between the optical element and the holding element or a contact area between the holding part and the holding element is 1% or less of an optical surface area of the optical element.

3. The optical element holder according to claim 1, wherein a contact area between the optical element and the holding element or a contact area between the holding part and the holding element is 0.1% or less of an optical surface area of the optical element.

4. The optical element holder according to claim 1, wherein a difference between a temperature of the holding part and a temperature of the holding element is 0.3 degree centigrade or smaller.

5. The optical element holder according to claim 1, wherein a difference between a temperature of the holding part and a temperature of the holding element is 0.1 degree centigrade or smaller.

6. The optical element holder according to claim 1, wherein the holding part includes an elastic element whose rigidity in a direction along a radial direction of the optical element is lower than rigidities in directions along any of five other axes.

7. The optical element holder according to claim 1, wherein the holding part includes an elastic element whose rigidity in a direction along a radial direction of the optical element is lower than 1% of rigidities in directions along any of five other axes.

8. The optical element holder according to claim 1, further comprising a temperature controller for controlling a temperature of the optical element by radiation,
wherein the temperature controller includes:
a radiation element facing the optical element,
a Peltier device arranged near or on a side of the radiation element opposite to the optical element; and
a controller for controlling the Peltier device.

9. The optical element holder according to claim 1, further comprising a temperature controller for controlling a temperature of the optical element by radiation,
wherein the temperature controller includes:

a radiation element facing the optical element, a temperature sensor for detecting a temperature of the optical element and/or a temperature of the holding part, a Peltier device arranged near or on a side of the radiation element opposite to the optical element, a temperature maintaining element arranged near or on a side of the Peltier device opposite to the radiation element; and a controller for controlling the Peltier device, in accordance with a detected result of the temperature sensor, so that the temperature of the optical element is substantially at a specific target temperature, wherein the specific target temperature and the temperature of the temperature maintaining element are substantially the same.

10. The optical element holder according to claim 1, further comprising:

a radiation element facing the holding element and/or a second temperature controller for controlling a temperature of the holding element using an electric heater, a first temperature sensor for detecting a temperature of the optical element and/or a temperature of the holding part, a second temperature sensor for detecting a temperature of the holding element; and a controller for controlling the temperature controller in accordance with detected results of the first temperature sensor and the second temperature sensor.

11. A device fabricating method comprising the steps of: exposing an object by using an exposure apparatus which includes an optical element, an optical element holder for holding the optical element which includes a holding element to hold the optical element or a holding part integrated with the optical element, wherein there is substantially no heat exchange between the optical element and the holding element or the holding part and the holding element, and an optical system for guiding light from a light source to an object, said optical system including the optical element; and developing the object that has been exposed.

* * * * *